(12) United States Patent
Choi et al.

(10) Patent No.: US 7,199,061 B2
(45) Date of Patent: Apr. 3, 2007

(54) PECVD SILICON OXIDE THIN FILM DEPOSITION

(75) Inventors: Soo Young Choi, Fremont, CA (US); Beom Soo Park, San Jose, CA (US); Quanyuan Shang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 342 days.

(21) Appl. No.: 10/420,417

(22) Filed: Apr. 21, 2003

(65) Prior Publication Data

US 2004/0209487 A1    Oct. 21, 2004

(51) Int. Cl.
*H01L 21/469*   (2006.01)
*H01L 21/31*   (2006.01)

(52) U.S. Cl. .................. 438/738; 438/787; 257/E21.19; 257/E21.279

(58) Field of Classification Search ................ 438/758, 438/674, 164, 788, 487, 787
See application file for complete search history.

(56) References Cited

U.S. PATENT DOCUMENTS

| | | | |
|---|---|---|---|
| 4,239,811 A | 12/1980 | Kemlage | ..................... 427/95 |
| 5,861,197 A | 1/1999 | Law et al. | ................... 427/579 |
| 5,923,988 A | 7/1999 | Cheng et al. | ............... 438/305 |
| 5,926,728 A | 7/1999 | Lee et al. | .................... 438/586 |
| 6,068,884 A | 5/2000 | Rose et al. | .............. 427/255.6 |
| 6,077,758 A * | 6/2000 | Zhang et al. | ............... 438/486 |
| 6,258,637 B1 | 7/2001 | Wilk et al. | ................... 438/151 |
| 6,294,219 B1 | 9/2001 | Tsai et al. | .................... 427/314 |
| 6,352,594 B2 * | 3/2002 | Cook et al. | ................. 118/724 |
| 6,444,507 B1 * | 9/2002 | Miyasaka | .................... 438/164 |
| 6,451,390 B1 | 9/2002 | Goto et al. | ................. 427/579 |
| 6,566,276 B2 * | 5/2003 | Maloney et al. | ............ 438/758 |
| 6,573,182 B2 * | 6/2003 | Sandhu et al. | ............. 438/674 |
| 6,586,349 B1 * | 7/2003 | Jeon et al. | ................... 438/785 |
| 6,673,126 B2 * | 1/2004 | Miyasaka | .................. 29/25.01 |
| 6,825,134 B2 * | 11/2004 | Law et al. | ................... 438/788 |
| 2002/0086166 A1 | 7/2002 | Hendricks et al. | .......... 428/447 |
| 2002/0187644 A1 | 12/2002 | Baum et al. | ................ 438/700 |

OTHER PUBLICATIONS

U.S. Appl. No. 10/254,627, filed on Sep. 24, 2002 (AMAT/6320).

* cited by examiner

*Primary Examiner*—Alexander Ghyka
(74) *Attorney, Agent, or Firm*—Patterson & Sheridan LLP

(57) ABSTRACT

A method of depositing a gate dielectric layer for a thin film transistor is provided. The gate dielectric layer is deposited using a plasma enhanced deposition with a gas mixture comprising a silicon and chlorine containing compound.

19 Claims, 6 Drawing Sheets

PECVD SILICON OXIDE THIN FILM DEPOSITION

BACKGROUND OF THE INVENTION

1. Field of the Invention

Embodiments of the present invention generally relate to a method of depositing a gate dielectric layer of a thin film transistor (TFT).

2. Description of the Related Art

Active matrix liquid crystal displays (AMLCD) have eliminated many problems associated with passive displays. For example, the fabrication of active matrix liquid crystal displays has enabled display screens to achieve greater brightness, enhanced readability, a greater variety of color shades, and broader viewing angles compared to displays that employ other technologies. Active matrix liquid crystal displays generally comprise an array of picture elements called pixels. An electronic switch is associated with each pixel in the display to control the operation thereof. Various electronic switches, such as thin film transistors (TFTs) and organic light emitting diodes (OLEDs), have been investigated to control pixel operation. Thin film transistors, in particular, offer a high degree of design flexibility and device performance.

Thin film transistors generally are formed on large area substrates having a high degree of optical transparency, such as glass substrates. FIG. 1 depicts a cross-sectional schematic view of a thin film transistor 122 having a bottom gate structure. The thin film transistor 122 includes a glass substrate 101 having an underlayer 102 formed on the surface thereof. A gate is formed on the underlayer 102. The gate comprises a gate metal layer 104 and a gate dielectric 108. The gate controls the movement of charge carriers in the transistor. The gate dielectric 108 formed over the gate metal layer 104 electrically isolates the gate metal layer 104 from semiconductor layers 110, 114a, 114b, formed thereon, each of which may function to provide charge carriers to the transistor. An etch stop layer 112 is formed on the semiconductor layer 110. A source region 118a of the transistor is formed on semiconductor layer 114a, and a drain region 118b of the transistor is formed on semiconductor layer 114b. A passivation layer 120 encapsulates the TFT 122 to protect it from environmental hazards such as moisture and oxygen. A conductive layer 116 is formed in the passivation layer 120.

FIG. 1 shows only one of the many types of TFTs. Other TFT structures having similar types of layers in different arrangements can be formed by using different deposition and patterning sequences.

For TFTs of any structure, each layer is critical with respect to the electrical performance of the TFT. In particular, the gate dielectric layer must have certain qualities, e.g., low flatband voltage ($V_{fb}$) and high breakdown voltage ($V_B$), in order for the transistor to have overall desirable electrical characteristics, such as low charge density (Dit), low threshold voltage ($V_{th}$), and low leakage current, among others.

It is particularly desirable that low temperature polysilicon (LTPS) TFTs have a low flatband voltage. LTPS TFTs generally provide displays having a higher resolution than displays containing amorphous silicon TFTs due to the greater mobility of electrons through LTPS TFTs than through amorphous silicon TFTs. The greater mobility of electrons through LTPS TFTs also increases the importance of achieving a low flatband voltage.

While methods have been developed to deposit gate dielectric layers for TFTs, there remains a need for a method of depositing gate dielectric layers with improved electrical characteristics.

SUMMARY OF THE INVENTION

Embodiments of the invention generally provide a plasma enhanced chemical vapor deposition process for depositing a gate dielectric layer on a substrate.

In one embodiment, a gas mixture including a silicon and chlorine containing compound, an oxidizing agent, and a reducing agent is introduced into a chamber and reacted in the presence of RF power to deposit a gate dielectric layer comprising silicon and oxygen on the substrate. The gas mixture is reacted under conditions such that the gate dielectric layer has a flatband voltage having an absolute value of less than about 1V without being annealed.

In another embodiment, a gas mixture including a silicon and chlorine containing compound, an oxidizing agent, and a reducing agent is reacted in the presence of RF power to deposit one gate dielectric layer, and a gas mixture including tetraethoxysilane, helium, and oxygen is reacted in the presence of RF power to deposit another gate dielectric layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the present invention include a method of depositing a gate dielectric layer using plasma enhanced chemical vapor deposition. The gate dielectric layer comprises silicon and oxygen and is deposited from a gas mixture comprising a silicon and chlorine containing compound. Typically, the gate dielectric layer is deposited such that it has a flatband voltage having an absolute value of less than about 1V.

As defined herein, "absolute value" is the non-negative value of a number. For example, the absolute value of −3 is 3. The sign of a flatband voltage is dependent on the type of substrate on which the dielectric layer is deposited. For example, dielectric layers deposited on p-type substrates have negative flatband voltages, while dielectric layers deposited on n-type substrates have positive flatband voltages. Thus, a flatband voltage of −0.5 obtained using a p-type substrate and a flatband voltage of 0.5 obtained using a n-type substrate both are flatband voltages having an absolute value of 0.5.

Figure 1:
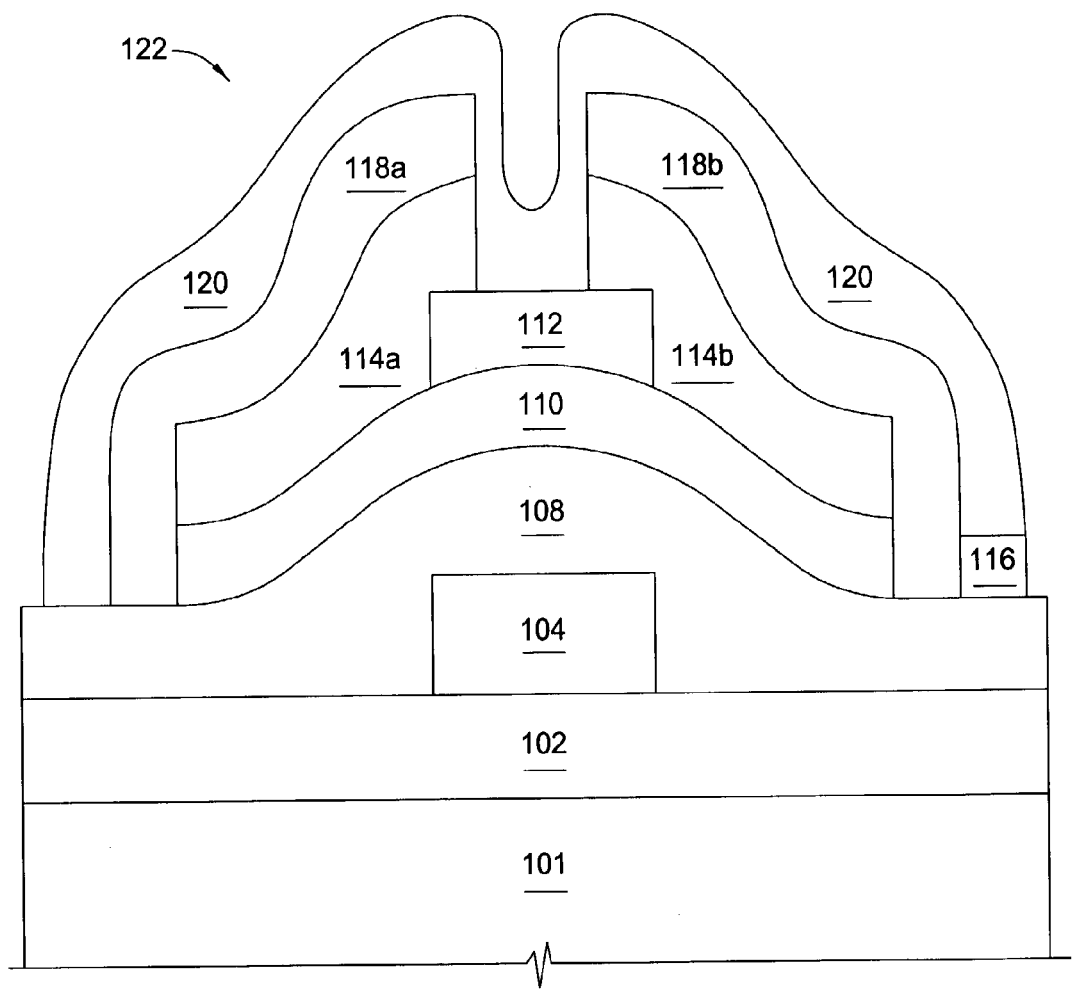
FIG. 1 depicts a cross-sectional schematic view of a prior art bottom-gate thin film transistor.
Figure 2:
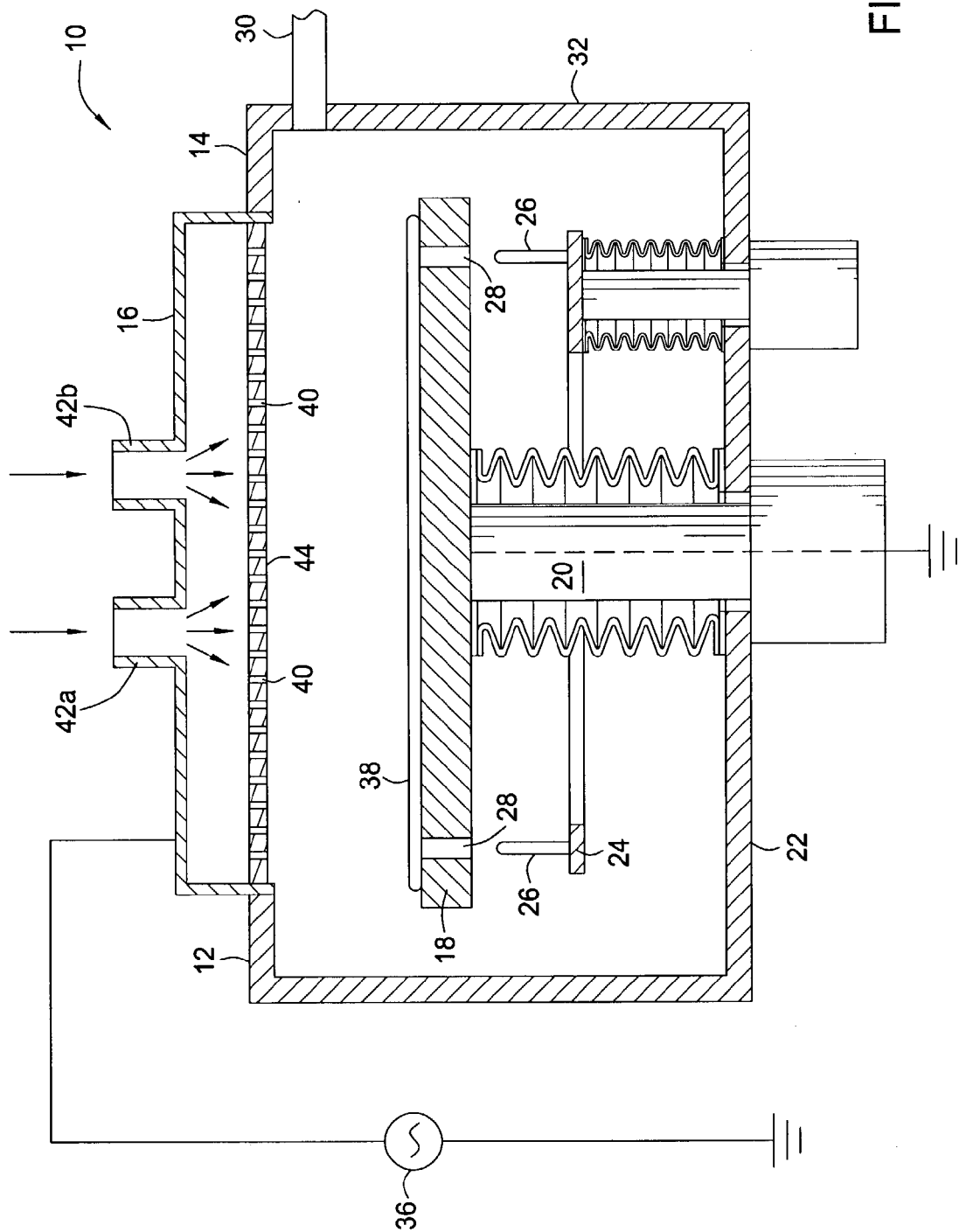
FIG. 2 depicts a schematic, cross-sectional view of a process chamber that may be used to practice embodiments described herein.

FIG. 2 shows a schematic sectional view of a process chamber apparatus 10 in which embodiments of the present invention may be carried out. Apparatus 10 comprises a deposition chamber body 12 that has a top wall 14 with an opening therethrough and a first electrode 16 that can act as a gas inlet manifold within the opening. Alternatively, the top wall 14 can be solid with the electrode 16 being adjacent to the inner surface of top wall 14. Within chamber body 12 is a susceptor 18 in the form of a plate that extends parallel to the first electrode 16. The susceptor 18 may be made of aluminum and coated with a layer of aluminum oxide. The susceptor 18 is connected to ground so that it serves as a second electrode. The susceptor 18 is mounted on the end of a shaft 20 that extends vertically through a bottom wall 22 of the deposition chamber body 12. The shaft 20 is movable vertically so as to permit movement of the susceptor 18 vertically toward and away from the first electrode 16. A lift-off plate 24 extends horizontally between the susceptor 18 and the bottom wall 22 of the deposition chamber body 12 substantially parallel to the susceptor 18. Lift-off pins 26 project vertically upwardly from the lift-off plate 24. The lift-off pins 26 are positioned to be able to extend through holes 28 in the susceptor 18, and are of a length slightly longer than the thickness of the susceptor 18. While there are only two lift-off pins 26 shown in the figure, there may be more of the lift-off pins 26 spaced around the lift-off plate 24. A gas outlet 30 extends through a side wall 32 of the deposition chamber body 12 and is connected to means (not shown) for evacuating the deposition chamber body 12. One or more gas inlet pipes 42a, 42b extend through the first electrode 16 of the deposition chamber body 12, and are connected through a gas switching network (not shown) to sources (not shown) of various gases. Gases introduced into the chamber through the one or more gas inlet pipes 42a, 42b pass through holes 40 in a diffuser or showerhead 44 in the upper portion of the deposition chamber body 12. The first electrode 16 is connected to an RF power source 36. A transfer plate (not shown) is typically provided to carry substrates through a load-lock door (not shown) into the deposition chamber body 12 and onto the susceptor 18, and also to remove the coated substrate from the deposition chamber body 12.

In the operation of the process chamber 10, a substrate 38 is first loaded into the deposition chamber body 12 and is placed on the susceptor 18 by the transfer plate (not shown). The substrate 38 is of a size to extend over the holes 28 in the susceptor 18. The susceptor 18 lifts the substrate 38 off the lift-off pins 26 by moving shaft 20 upwards such that the lift-off pins 26 do not extend through the holes 28, and the susceptor 18 and substrate 38 are relatively close to the first electrode 16. The electrode spacing or the distance between the substrate surface and the discharge surface of the first electrode 16 may be optimized depending on the kind of precursor and process gas used, as well as on the desired properties of the resulting film.

Gate Dielectric Layer Deposition

In one embodiment, a gas mixture comprising a silicon and chlorine containing compound, an oxidizing agent, and a reducing agent is introduced into a chamber, such as the chamber body 12 of FIG. 2. The silicon and chlorine containing compound may be, for example, dichlorosilane ($Si_2Cl_2H_2$), hexachlorosilane ($Si_2Cl_6$), silicon tetrachloride ($SiCl_4$), chlorosilane ($SiClH_3$), trichlorosilane ($SiCl_3H$), or a combination thereof. The oxidizing agent may be, for example, oxygen ($O_2$), ozone ($O_3$), nitrous oxide ($N_2O$), water vapor ($H_2O$), or a combination thereof. The reducing agent may be, for example, hydrogen ($H_2$), water vapor, or a combination thereof. Water vapor alone may be used instead of a separate oxidizing agent and reducing agent.

The silicon and chlorine containing compound may be introduced into the chamber at a flow rate of about 10 sccm to about 200 sccm. The oxidizing agent may be introduced into the chamber at a flow rate of about 1000 sccm to about 5 liters/minute (l/min). The reducing agent may be introduced into the chamber at a flow rate of about 3000 sccm to about 10 l/min. Preferably, the ratio of the combined flow rate of the oxidizing agent and the reducing agent to the flow rate of the silicon and chlorine containing compound is about 20:1 to about 800:1. More preferably, the ratio of the combined flow rate of the oxidizing agent and the reducing agent to the flow rate of the silicon and chlorine containing compound is about 50:1 to about 500:1. It is recognized that the flow rates may vary according to the volume of the chamber and the size of the substrate used. The flow rates described herein are preferred flow rates for a 370 mm by 470 mm substrate in an AKT 1600 chamber, available from Applied Materials, Santa Clara, Calif., which as a volume of about 48 liters.

The silicon and chlorine containing compound, the oxidizing agent, and the reducing agent may be introduced into the chamber together through one inlet or separately through multiple inlets. Preferably, the oxidizing agent and the reducing agent are introduced into the chamber through one inlet and the silicon and chlorine containing compound is introduced into the chamber through another inlet so that a desirable vapor pressure for the silicon and chlorine containing compound may be obtained. Optionally, the silicon and chlorine containing compound may be introduced into the chamber with a carrier gas such as helium or argon.

The gas mixture is reacted in the chamber in the presence of RF power that generates a plasma in the chamber. The RF power level may be about 600 W to about 3000 W. The RF power may have a frequency of about 13.56 MHz. The chamber pressure may be about 0.5 to about 3.0 torr, and the chamber temperature may be about 200° C. to about 500° C. Preferably, the gas mixture is reacted in the presence of RF power under conditions sufficient to deposit a gate dielectric layer comprising silicon and oxygen and having a flatband voltage having an absolute value of less than about 1 V without annealing the gate dielectric layer.

Generally, the oxidizing agent oxidizes the silicon and chlorine containing compound, and a silicon and oxygen containing layer is deposited on a substrate in the chamber. Generally, the reducing agent reacts with chlorine from the silicon and chlorine containing compound to form material(s), such as HCl, that can be removed from the chamber. However, some chlorine may be incorporated within or associated with the silicon and oxygen containing layer. Preferably, the silicon and oxygen containing layer contains little or no chlorine.

In another embodiment, a gate dielectric comprising a layer deposited from one gas mixture and a layer deposited from another gas mixture is provided. For example, a gas mixture comprising a silicon and chlorine containing compound, an oxidizing agent, and a reducing agent may be introduced into a chamber and reacted in the presence of RF power to deposit a first gate dielectric layer comprising silicon and oxygen. Subsequently, another gas mixture comprising a silicon source and an oxygen source may be introduced into the chamber and reacted in the presence of RF power to deposit a second gate dielectric layer comprising silicon and oxygen on the first gate dielectric layer. Alternatively, a gas mixture comprising a silicon source and an oxygen source may be introduced into a chamber and reacted in the presence of RF power in the chamber to deposit a first gate dielectric layer comprising silicon and oxygen. Subsequently, another gas mixture comprising a silicon and chlorine containing compound, an oxidizing agent, and a reducing agent may be introduced into the chamber and reacted in the presence of RF power in the chamber to deposit a second gate dielectric layer comprising silicon and oxygen on the first gate dielectric layer. In one embodiment, the gas mixture comprising a silicon source and an oxygen source includes tetraethoxysilane, helium, and oxygen. In another embodiment, the gas mixture comprising a silicon source and an oxygen source includes silane and nitrous oxide. Preferably, the gate dielectrics described herein that include one layer deposited from one gas mixture and another layer deposited from another gas mixture are not annealed.

Bottom-Gate TFT Fabrication Processes

Figure 3A:
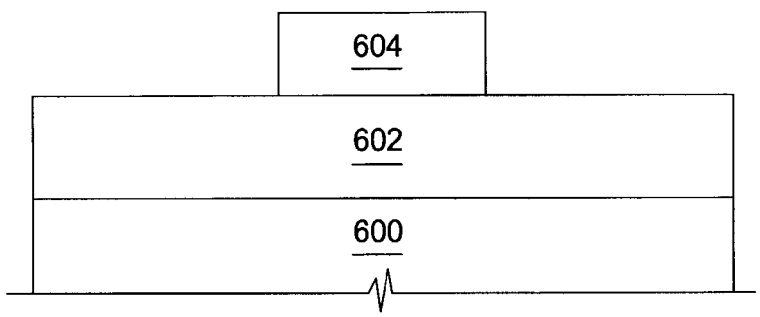
FIGS. 3A–3C depict cross-sectional views of a substrate at different stages of a bottom-gate TFT fabrication sequence.
Figure 3B:
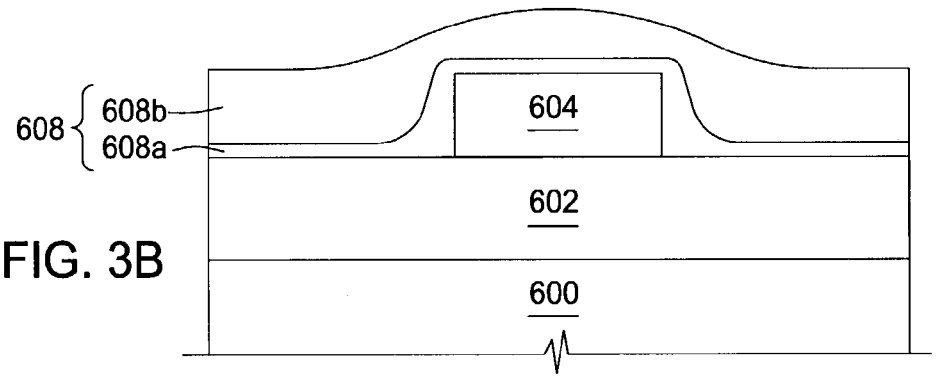
Figure 3C:
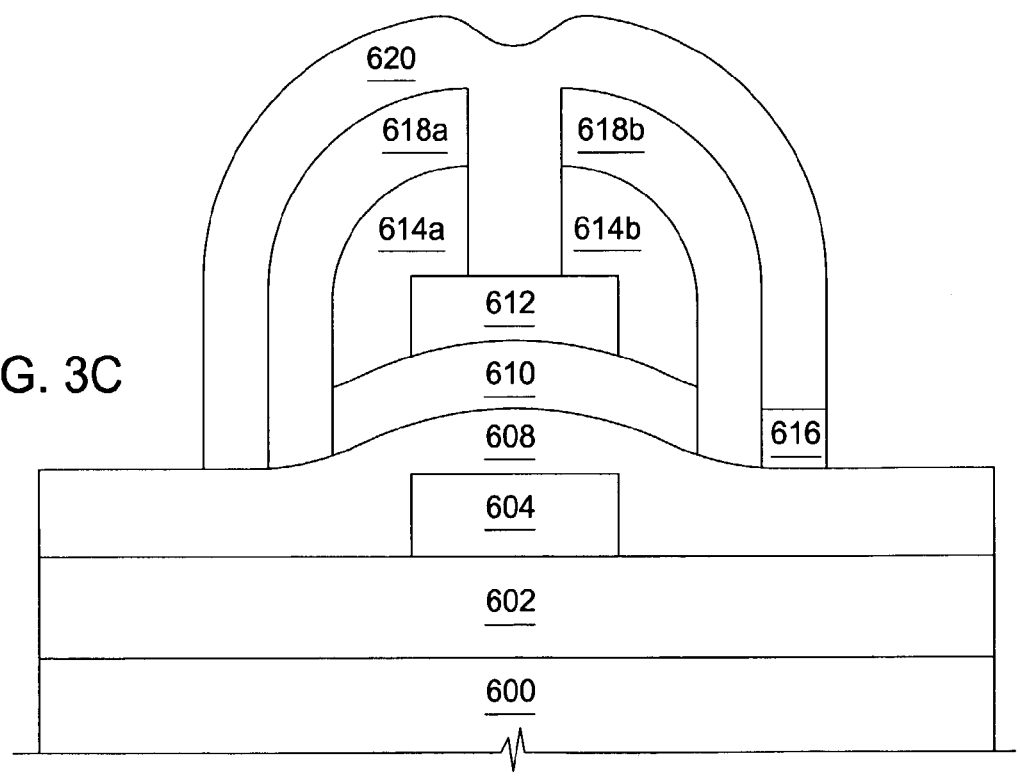

FIGS. 3A–3C illustrate cross-sectional schematic views of a structure during different stages of a bottom-gate thin film transistor fabrication sequence incorporating a gate dielectric layer formed using a plasma enhanced chemical vapor deposition process. This particular transistor fabrication sequence is for a switch in an active matrix liquid crystal display, and the process depicts the formation of one embodiment of an array of switches used in an active matrix liquid crystal display. FIG. 3A, for example, illustrates a cross-sectional view of a structure including substrate 600. The substrate 600 may comprise a material that is essentially optically transparent in the visible spectrum, such as, for example, glass or clear plastic, including soda-lime glass, borosilicate glass, or quartz glass. The substrate may be of varying shapes or dimensions. Typically, for TFT applications, the substrate is a glass substrate with a surface area greater than about 500 mm$^2$.

The substrate 600 may have an underlayer 602 thereon. The underlayer 602 may be an insulating material, for example, such as silicon dioxide ($SiO_2$) or silicon nitride (SiN). The underlayer 602 may be formed using conventional deposition techniques.

A gate metal layer 604 is formed on the underlayer 602. The gate metal layer 604 comprises an electrically conductive layer that controls the movement of charge carriers within the TFT. The gate metal layer 604 may comprise a metal such as, for example, aluminum (Al), tungsten (W), chromium (Cr), tantalum (Ta), or combinations thereof, among others. The gate metal layer 604 may be formed using conventional deposition, lithography and etching techniques.

Referring to FIG. 3B, a gate dielectric layer 608 is formed on the gate metal layer 604. The gate dielectric layer 608 may comprise silicon and oxygen deposited using an embodiment of a plasma enhanced chemical vapor deposition technique described above. The gate dielectric layer 608 may be formed to a thickness in the range of about 100 Å to about 5000 Å.

In one embodiment, the gate dielectric layer 608 may comprise two or more layers 608a and 608b, as shown in FIG. 3B. The first gate dielectric layer 608a may have a thickness of about 0 Å to about 4900 Å, such as about 10 Å to about 4900 Å, and the second gate dielectric layer 608b may have a thickness of about 100 Å to about 1000 Å. The first gate dielectric layer 608a may be deposited from a mixture comprising a silicon and chlorine containing compound, an oxidizing agent, and a reducing agent, and a second gate dielectric layer 608b may be deposited on the first gate dielectric layer from a mixture comprising tetraethoxysilane, helium, and oxygen, as described herein. Alternatively, the first gate dielectric layer 608a may be deposited from a mixture comprising tetraethoxysilane, helium, and oxygen, and the second gate dielectric layer 608b may be deposited on the first gate dielectric layer from a mixture comprising a silicon and chlorine containing compound, an oxidizing agent, and a reducing agent. Preferably, the second gate dielectric layer 608b, which is the layer that contacts the semiconductor layer 610, is deposited from a mixture comprising a silicon and chlorine containing compound, an oxidizing agent, and a reducing agent. It is believed that the dielectric layer deposited from the silicon and chlorine containing compound, an oxidizing agent, and a reducing agent adheres better to a polysilicon semiconductor layer than a dielectric layer deposited from tetraethoxysilane, helium, and oxygen.

Referring to FIG. 3C, a bulk semiconductor layer 610 is formed on the gate dielectric layer 608. Bulk semiconductor layer 610 may be formed using conventional deposition techniques. The bulk semiconductor layer 610 may comprise polycrystalline silicon (polysilicon). Bulk semiconductor layer 610 may be deposited to a thickness within a range of about 100 Å to about 3000 Å.

An etch stop layer 612 may be formed on bulk semiconductor layer 610. The etch stop layer 612 may comprise an insulating material, such as silicon nitride. The etch stop layer 612 may be formed using, for example, plasma enhanced chemical vapor deposition, chemical vapor deposition, physical vapor deposition, or other conventional methods known to the art. Etch stop layer 612 and bulk semiconductor layer 610 are lithographically patterned and etched using conventional techniques.

A doped semiconductor layer 614 is formed on the patterned etch stop layer 612 and semiconductor bulk layer 610. Doped semiconductor layer 614 may comprise, for example, silicon. The doped semiconductor layer 614 may be deposited to a thickness within a range of about 100 Å to about 500 Å. The doped semiconductor layer 614 directly contacts portions of the bulk semiconductor layer 610, forming a semiconductor junction.

A conductive layer 618 is formed on portions of the doped semiconductor layer 614 and the transparent conductor layer 616. Conductive layer 618 may comprise a metal such as, for example, aluminum (Al), tungsten (W), molybdenum (Mo), chromium (Cr), tantalum (Ta), and combinations thereof, among others. The conductive layer 618 may be formed using conventional deposition techniques.

Both the conductive layer 618 and the doped semiconductor layer 614 may be lithographically patterned to define a source region 614a and a drain region 614b as well as a source contact 618a and a drain contact 618b. The source 614a and drain 614b regions of the TFT are separated from one another by the etch stop layer 612.

Thereafter, a passivation layer 620 may be deposited. Passivation layer 620 conformably coats exposed surfaces of gate dielectric layer 608, source contact 618a, drain contact 618b, etch stop layer 612, and semiconductor source 614a and drain 614b. The passivation layer 620 is generally an insulator and may comprise, for example, silicon oxide or silicon nitride. The passivation layer 620 may be formed using conventional deposition techniques.

A transparent conductor layer 616 is then deposited in a hole created in the passivation layer 620. The transparent conductor layer 616 contacts a portion of the gate dielectric layer 608. Transparent conductor layer 616 comprises a material that is generally optically transparent in the visible spectrum and is electrically conductive. Transparent conductor layer 616 may comprise, for example, indium tin oxide (ITO), zinc oxide, among others.

Top-Gate TFT Fabrication Sequence

Figure 4A:
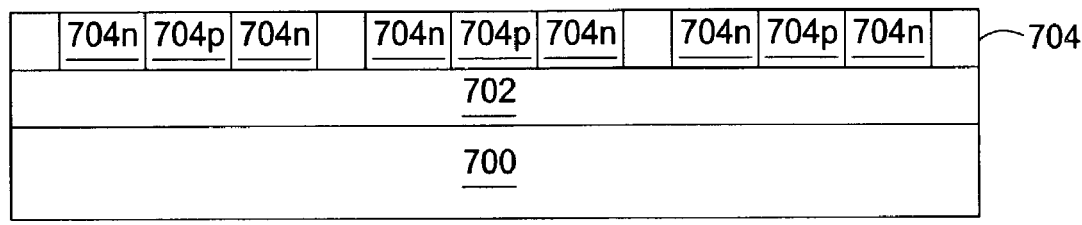
FIGS. 4A–4C depict cross-sectional views of a substrate at different stages of a top-gate TFT fabrication sequence.
Figure 4B:
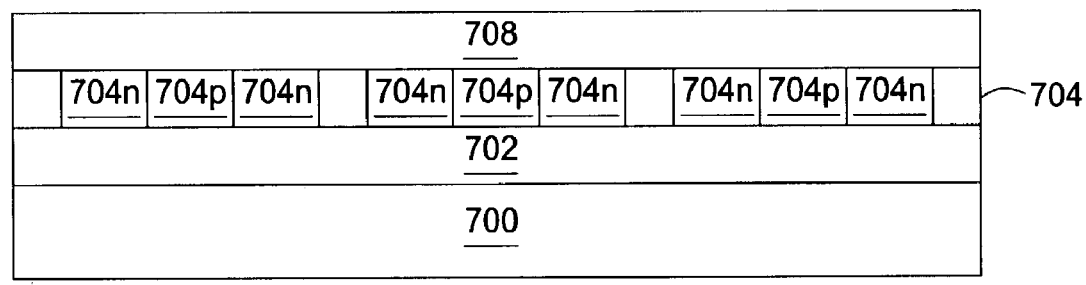
Figure 4C:
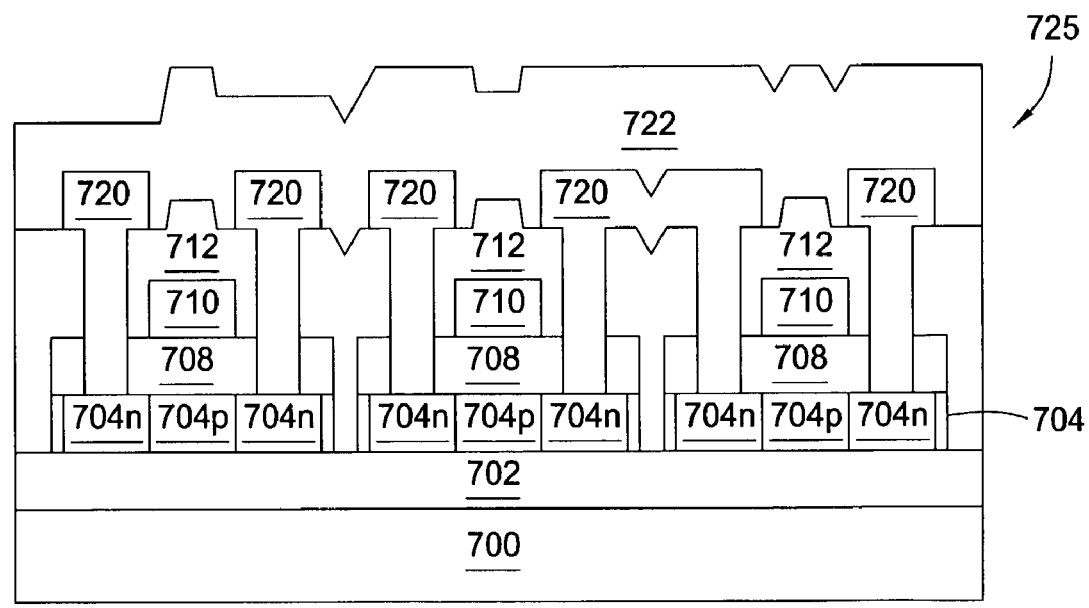

FIGS. 4A–4C illustrate cross-sectional schematic views of substrate structure 725 during different stages of a top-gate TFT fabrication sequence incorporating a gate dielectric layer formed using a plasma enhanced chemical vapor deposition process, as described herein. This transistor fabrication sequence is for a switch in an active matrix liquid crystal display, and the process depicts the formation of one of an array of switches used in an active matrix liquid crystal display. The top-gate TFT may be, for example, a metal-oxide-semiconductor field effect transistor (MOSFET) or a junction field effect transistor (JFET).

FIG. 4A illustrates a cross-sectional view of a substrate 700. The substrate may comprise a material that is essentially optically transparent in the visible spectrum, such as, for example, glass or clear plastic, including soda-lime glass, borosilicate glass, or quartz. The substrate may have an underlayer 702 thereon. The underlayer 702 may be an insulating material, such as, for example, silicon oxide or silicon nitride.

A doped semiconductor layer 704 is deposited on the underlayer 702. The doped semiconductor layer 704 may comprise polysilicon. The doped semiconductor layer 704 includes n-type doped regions 704n and p-type doped regions 704p. The interfaces between n-type regions 704n and p-type regions 704p are semiconductor junctions that allow the TFT to act as a switching device.

Referring to FIG. 4B, a gate dielectric layer 708 is deposited on the n-type doped regions 704n and the p-type doped regions 704p. The gate dielectric layer 708 may be formed using an embodiment of the plasma enhanced chemical vapor deposition process described herein. The gate dielectric layer 708 may be deposited to a thickness within a range of about 20 Å to about 5000 Å.

In one embodiment, the gate dielectric layer 708 may comprise two or more dielectric layers. For example, a first gate dielectric layer may be deposited from a mixture comprising tetraethoxysilane, helium, and oxygen, and a second gate dielectric layer may be deposited on the first gate dielectric layer from a mixture comprising a silicon and chlorine containing compound, an oxidizing agent, and a reducing agent. Alternatively, a first gate dielectric layer may be deposited from a mixture comprising a silicon and chlorine containing compound, an oxidizing agent, and a reducing agent, and a second gate dielectric layer may be deposited on the first gate dielectric layer from a mixture comprising tetraethoxysilane, helium, and oxygen. Preferably, the first gate dielectric layer, which is the layer that contacts the semiconductor layer 704, is deposited from a mixture comprising a silicon and chlorine containing compound, an oxidizing agent, and a reducing agent.

A gate metal layer 710 is deposited on the gate dielectric layer 708, as shown in FIG. 4C. The gate metal layer 710 comprises an electrically conductive layer that controls the movement of charge carriers within the TFT. The gate metal layer 710 may comprise a metal such as, for example, aluminum (Al), tungsten (W), chromium (Cr), tantalum (Ta), or combinations thereof, among others. The gate metal layer 710 may be formed using conventional deposition techniques. After deposition, the gate metal layer is patterned to define gates using conventional lithography and etching techniques.

After the gate metal layer 710 is formed, an interlayer dielectric 712 is formed thereon. The interlayer dielectric 712 may comprise, for example, silicon oxide or silicon nitride. Interlayer dielectric 712 may be formed using conventional deposition processes.

The interlayer dielectric 712 is patterned to expose the n-type doped regions 704n and the p-type doped regions 704p. The patterned regions of the interlayer dielectric 712 are filled with a conductive material to form contacts 720. The contacts 720 may comprise a metal such as, for example, aluminum (Al), tungsten (W), molybdenum (Mo), chromium (Cr), tantalum (Ta), and combinations thereof, among others. The contacts 720 may be formed using conventional deposition techniques.

Thereafter, a passivation layer 722 may be formed thereon in order to protect and encapsulate a completed thin film transistor 725. The passivation layer 722 is generally an insulator and may comprise, for example, silicon oxide or silicon nitride. The passivation layer 722 may be formed using conventional deposition techniques.

It is within the scope of the invention to form other devices that have configurations of semiconductor layers that are different from those described in FIGS. 3A–3C and 4A–4C. For example, the switch may be any variety of bipolar or unipolar transistor devices wherein a gate dielectric layer is deposited using a plasma enhanced process described herein.

Figure 5:
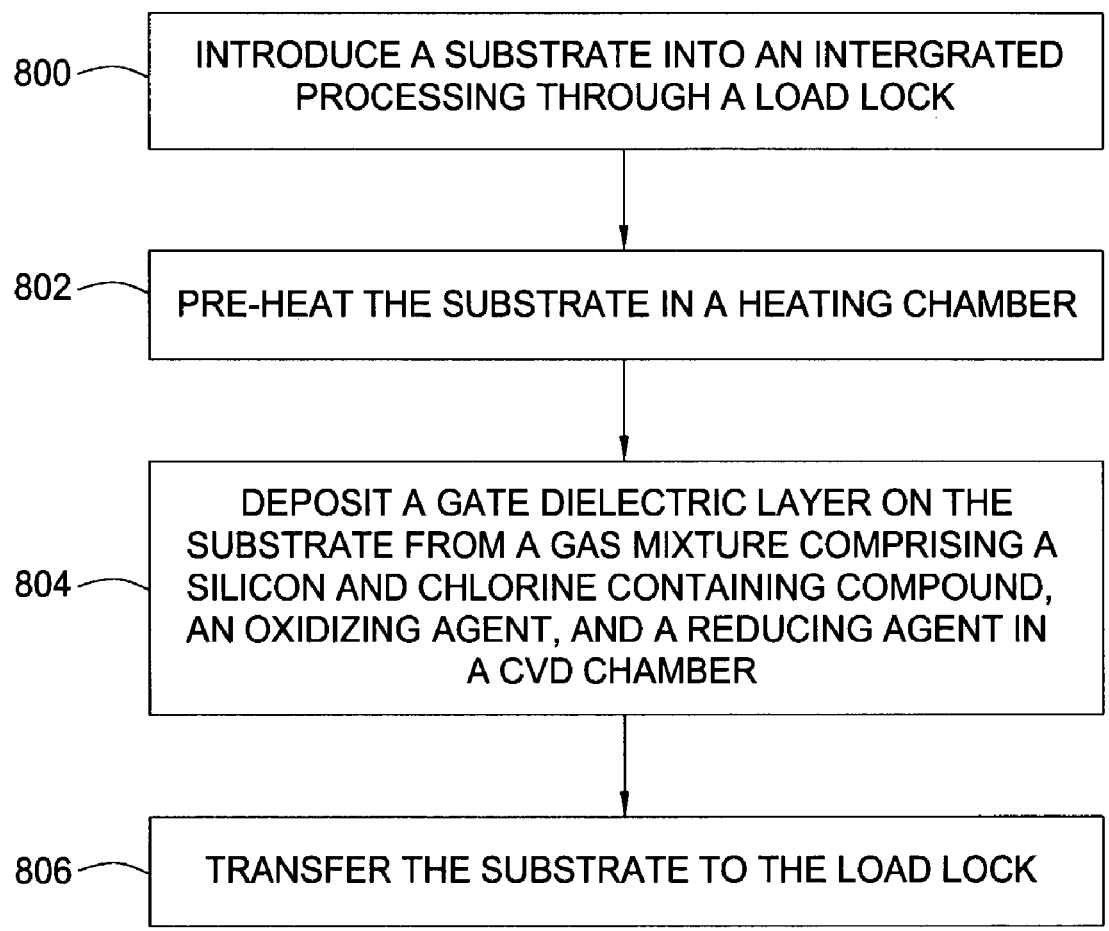
FIG. 5 illustrates a process sequence according to one embodiment of the present invention.

The gate dielectric layers described herein may be deposited within a chamber of an integrated processing system, such as the AKT PECVD 1600 System, available from Applied Materials, Inc. of Santa Clara, Calif. An example of an integrated processing sequence is illustrated in FIG. 5.

A substrate is introduced into an integrated processing system through a load lock, as shown in step 800. Optionally, the substrate is pre-heated at about 400° C. in a heating chamber, as shown in step 802. The substrate is then transferred to a CVD chamber, such as an AKT 1600 chamber, and a gate dielectric layer is deposited on the substrate from a gas mixture comprising a silicon and chlorine containing compound, an oxidizing agent, and a reducing agent, as shown in step 804. The substrate is then transferred from the chemical vapor deposition chamber to the load lock chamber, as shown in step 806, so that it can be removed from the processing system.

Embodiments of the invention are further described by the following examples which are not intended to limit the scope of the claimed invention.

EXAMPLES

Table 1 shows four sets of processing conditions that were used to deposit gate dielectric layers by introducing a gas mixture of silicon tetrachloride, hydrogen, and oxygen into an AKT 1600 chamber and reacting the gas mixture in the presence of RF power to deposit gate dielectric layers comprising silicon and oxygen on 370 mm×470 mm p-type silicon substrates.

TABLE 1

| Layer | Gas Flow (sccm) | | | RF (W) | Press (torr) | Spacing (mil) | Temp (° C.) |
|---|---|---|---|---|---|---|---|
| | SiCl$_4$ | H$_2$ | O$_2$ | | | | |
| 1 | 10 | 3000 | 1000 | 600 | 2.0 | 500 | 400 |
| 2 | 25 | 3000 | 1000 | 600 | 2.0 | 500 | 400 |
| 3 | 50 | 3000 | 1000 | 600 | 2.0 | 470 | 400 |
| 4 | 100 | 6000 | 2900 | 1500 | 2.0 | 470 | 400 |

Table 2 shows the flatband voltages of the four layers with and without annealing the layers for 10 minutes at 500° C. Table 2 also shows the flatband voltages of a comparative example layer deposited from tetraethoxysilane (TEOS), helium, and oxygen. The processing conditions for the comparative example layer included the following: a TEOS flow of 185 sccm, a helium flow of 50 sccm, an oxygen flow from 3500 sccm, 1150 W of RF power, a pressure of 0.85 torr, a spacing of 470 miles, and a temperature of 430° C.

TABLE 2

| Layer | Vfb As Deposited | Vfb After Annealing |
|---|---|---|
| 1 | −0.64 | −1.57 |
| 2 | −0.69 | −1.62 |
| 3 | −0.46 | −1.46 |
| 4 | −0.63 | |
| TEOS | −3.73 | −2.65 |

Figure 7:
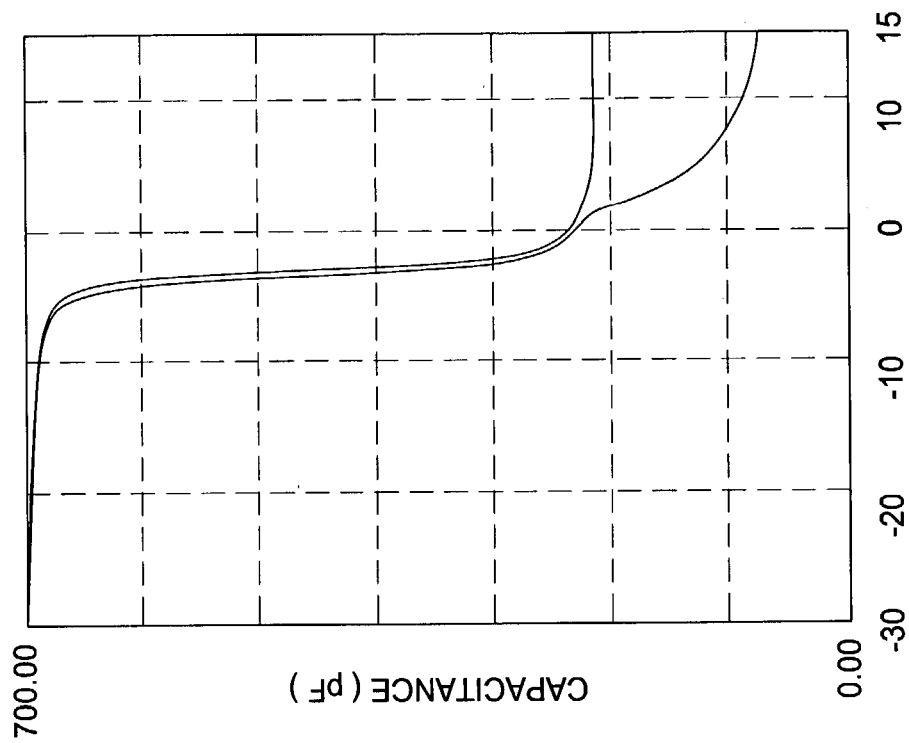
FIG. 7 shows the flatband voltage of a layer deposited according to a comparative example.
Figure 6:
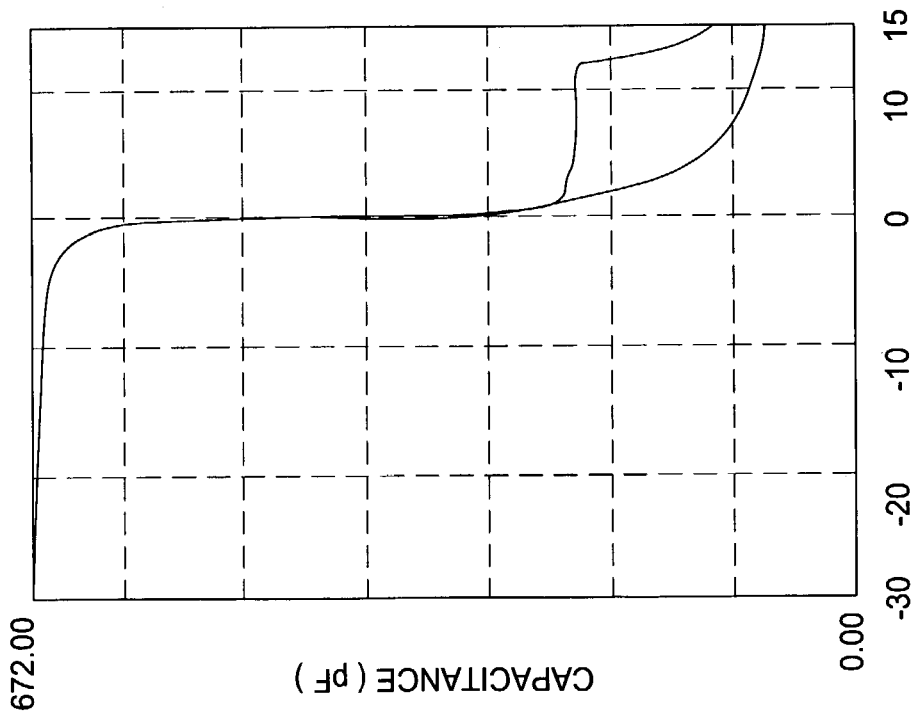
FIG. 6 shows the flatband voltage of a layer deposited according to an embodiment of the invention.

FIG. 6 shows the flatband voltage obtained for layer 3 without annealing and FIG. 7 shows the flatband voltage obtained for the comparative example TEOS layer without annealing.

Unexpectedly, the absolute value of the flatband voltages of the four layers was lower, i.e., less than 1 V, before annealing than after annealing. However, the absolute value of the TEOS layer flatband voltage was lower after annealing. Furthermore, the absolute value of the TEOS layer flatband voltage after annealing was still significantly higher than the flatband voltage of the four layers either before or after annealing.

It is believed that the use of a relatively low flow of a silicon and chlorine containing compound, such as less than about 200 sccm, with a higher flow of an oxidizing agent, such as at least about 1000 sccm, and a higher flow of a reducing agent, such as at least about 4000 sccm, may contribute to the desirable flatband voltages achieved herein. Preferably, the ratio of the combined flow rate of the oxidizing agent and the reducing agent to the flow rate of the silicon and chlorine containing compound is about 50:1 to about 500:1. Again, it is recognized that the flow rates may vary according to the volume of the chamber and the size of the substrate used.

Thus, embodiments described herein provide a method of depositing a gate dielectric layer with a flatband voltage having an absolute value of less than about 1V. It is believed that a gate dielectric layer having a flatband voltage having an absolute value of less than about 1V improves the performance of a TFT that includes such a gate dielectric layer. Furthermore, annealing of the gate dielectric layer is not required to achieve the desired flatband voltage range. Consequently, fewer process steps are required and substrate throughput, such as through an integrated processing system, is improved.

The gate dielectric layers deposited according to embodiments described herein have additional desirable properties. For example, the dielectric layers typically have a wet etch rate (WER) of less than about 1300 Å/min, compared to an ideal thermal oxide WER of about 1000 Å/min, which is believed to indicate that the dielectric layers are stable. The dielectric layers typically have good thickness uniformity, such as less than about 10% at 10 mm exclusion on a 370 mm×470 mm substrate, and low surface roughness, such as a rms (root mean square average) of less than about 3 Å. Generally, the dielectric layers have a breakdown voltage greater than 10 MV and a charge density of less than $3.0 \times 10^{10}$ eV/cm$^2$, preferably less than $1.0 \times 10^{10}$ eV/cm$^2$. The dielectric layers may be deposited at a rate of about 50 Å/min to about 500 Å/min, which contributes to a good substrate throughput rate.

While the foregoing is directed to embodiments of the present invention, other and further embodiments of the invention may be devised without departing from the basic scope thereof, and the scope thereof is determined by the claims that follow.

What is claimed is:

1. A plasma-enhanced chemical vapor deposition process for depositing a gate dielectric layer on a substrate, comprising:
   introducing a gas mixture comprising silicon tetrachloride, an oxidizing agent, and a reducing agent into a chamber; and
   reacting the gas mixture in the presence of RF power in the chamber to deposit a gate dielectric layer comprising silicon and oxygen on the substrate.

2. The process of claim 1, wherein the oxidizing agent is selected from the group consisting of oxygen, ozone, nitrous oxide, water vapor, and combinations thereof.

3. The process of claim 1, wherein the reducing agent is selected from the group consisting of hydrogen, water vapor, and combinations thereof.

4. The process of claim 1, wherein the oxidizing agent is water vapor and the reducing agent is water vapor.

5. The process of claim 1, wherein the silicon tetrachloride is introduced into the chamber at a flow rate of about 10 sccm to about 200 sccm.

6. The process of claim 1, wherein the reducing agent is introduced into the chamber at a flow rate of about 3000 sccm to about 10 l/min.

7. The process of claim 1, wherein the oxidizing agent is introduced into the chamber at a flow rate of about 1000 sccm to about 5 l/min.

8. The process of claim 1, wherein the RF power level is about 600 W to about 3000 W.

9. The process of claim 1, wherein the chamber has a pressure of about 0.5 to about 3.0 torr.

10. The process of claim 1, wherein the chamber temperature is about 200° C. to about 500° C.

11. The process of claim 1, further comprising pre-heating the substrate before introducing the gas mixture into the chamber.

12. The process of claim 1, further comprising:
   introducing a second gas mixture comprising tetraethoxysilane, oxygen, and helium into the chamber; and
   reacting the second gas mixture in the presence of RF power in the chamber to deposit another gate dielectric layer comprising silicon and oxygen.

13. A plasma-enhanced chemical vapor deposition process for depositing a gate dielectric layer of a thin film transistor, comprising:
   introducing a gas mixture comprising silicon tetrachloride, an oxidizing agent, and a reducing agent into a chamber; and
   reacting the gas mixture in the presence of RF power in the chamber under conditions sufficient to deposit a gate dielectric layer having a flatband voltage having an absolute value of less than about 1V without annealing the gate dielectric layer.

14. The process of claim 13, wherein a ratio of a combined flow rate of the oxidizing agent and the reducing agent to a flow rate of the silicon tetrachloride into the chamber is about 20:1 to about 800:1.

15. The process of claim 13, wherein the oxidizing agent and the reducing agent are introduced into the chamber together, and the silicon tetrachloride is introduced into the chamber separately from the oxidizing agent and the reducing agent.

16. The process of claim 15, wherein the silicon tetrachloride is introduced into the chamber with a carrier gas.

17. A plasma-enhanced chemical vapor deposition process for depositing a gate dielectric of a thin film transistor, comprising:
   introducing a first gas mixture comprising silicon tetrachloride, an oxidizing agent, and a reducing agent into a chamber;
   reacting the first gas mixture comprising silicon tetrachloride, an oxidizing agent, and a reducing agent in the presence of RF power in the chamber to deposit a gate dielectric layer comprising silicon and oxygen;
   introducing a second gas mixture comprising tetraethoxysilane, helium, and oxygen into the chamber; and
   reacting the second gas mixture comprising tetraethoxysilane, helium, and oxygen in the presence of RF power in the chamber to deposit another gate dielectric layer comprising silicon and oxygen.

18. The process of claim 17, wherein the first gas mixture is reacted to form a gate dielectric layer before the second gas mixture is reacted to form another gate dielectric layer.

19. The process of claim 17, wherein the second gas mixture is reacted to form a first gate dielectric layer before the first gas mixture is reacted to form another gate dielectric layer.

* * * * *